United States Patent [19]

Taverdet

[11] Patent Number: 4,680,673
[45] Date of Patent: Jul. 14, 1987

[54] ENCAPSULATED HOUSING FOR DISSIPATING HEAT PRODUCED BY ELECTRICAL CIRCUITS

[75] Inventor: Jean C. Taverdet, Orange, France
[73] Assignee: Societe Xeram, Courbevoie, France
[21] Appl. No.: 731,948
[22] Filed: May 8, 1985

[30] Foreign Application Priority Data

May 11, 1984 [FR] France ................................ 84 07297

[51] Int. Cl.$^4$ ............................................. H05K 7/20
[52] U.S. Cl. ................................... 361/385; 165/80.4; 357/82
[58] Field of Search .......................... 165/80.4, 104.33; 174/15 R, 16 HS; 357/82; 361/382, 385–389

[56] References Cited

U.S. PATENT DOCUMENTS

| | | | |
|---|---|---|---|
| 3,586,917 | 6/1971 | Oates | 361/385 |
| 4,180,414 | 12/1979 | Diamond et al. | 357/82 |
| 4,450,472 | 5/1984 | Tuckerman | 357/82 |

FOREIGN PATENT DOCUMENTS

| | | |
|---|---|---|
| 0094869 | 11/1983 | European Pat. Off. . |
| 2359148 | 8/1974 | Fed. Rep. of Germany ...... 361/385 |
| 2436498 | 9/1979 | France . |
| 2500215 | 2/1981 | France . |

Primary Examiner—Roy N. Envall, Jr.
Assistant Examiner—Gregory D. Thompson
Attorney, Agent, or Firm—Oblon, Fisher, Spivak, McClelland & Maier

[57] ABSTRACT

A housing or box for dissipation of the heat produced by electrical circuits. The housing includes a metallic armature which has an upper portion with a hermetic recess in which are disposed the electrical circuits, and a lower portion for cooling with a cooling fluid. The cooling portion includes a single-piece metallic assembly in which are formed channels and openings between the channels in such a way that a circulation network for the cooling fluid is formed.

17 Claims, 8 Drawing Figures

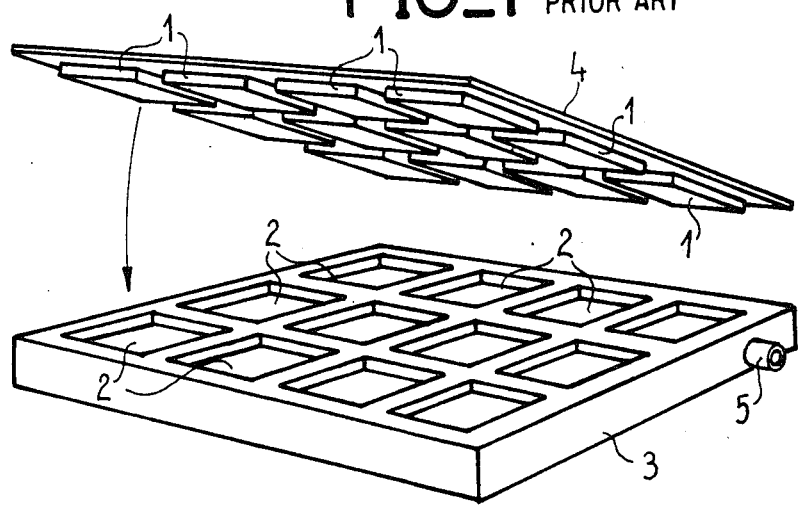
FIG_1 PRIOR ART
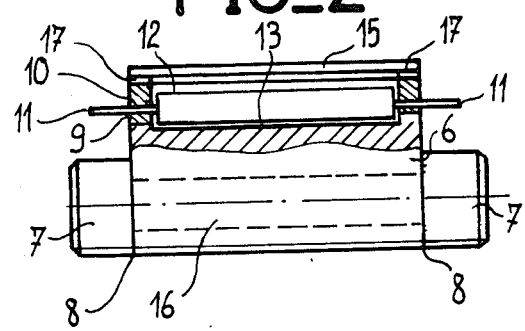
FIG_2
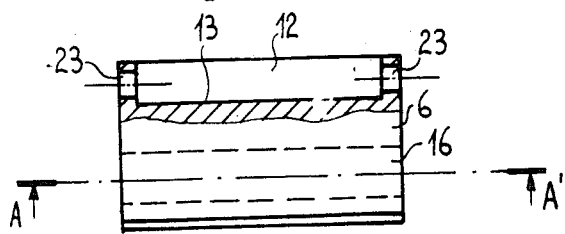
FIG_3

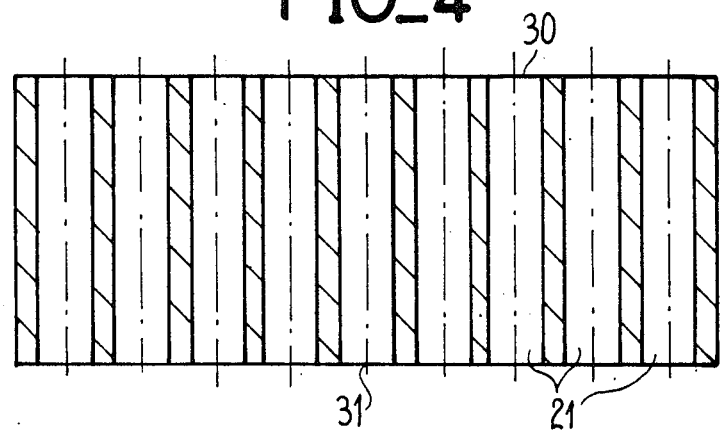
FIG_4
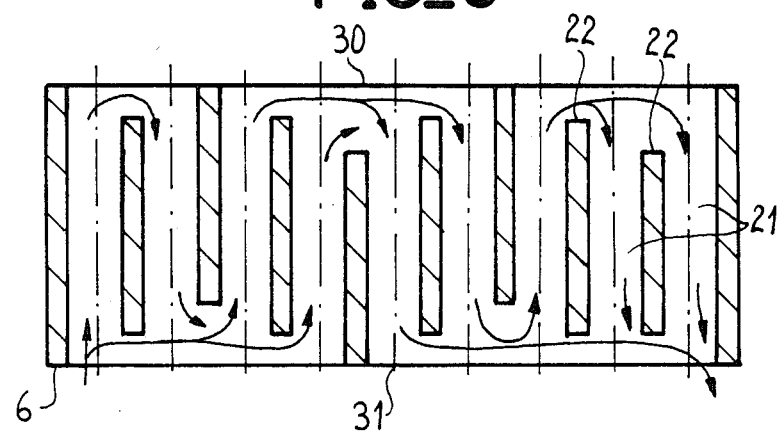
FIG_5
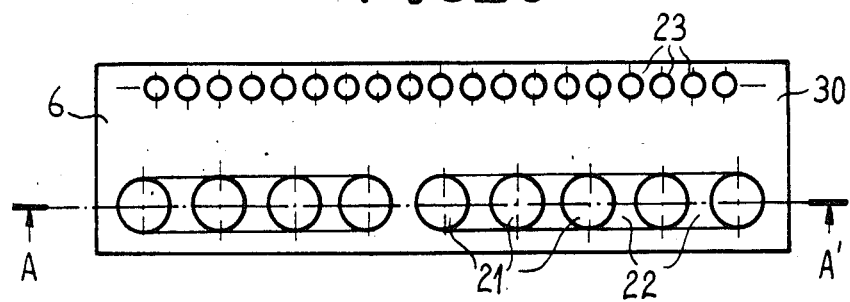
FIG_6

FIG_7
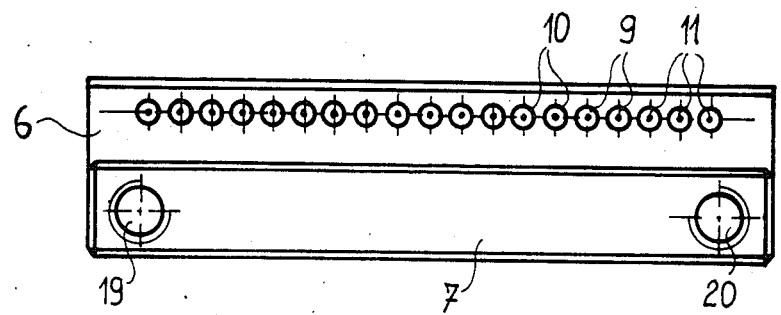
FIG_8
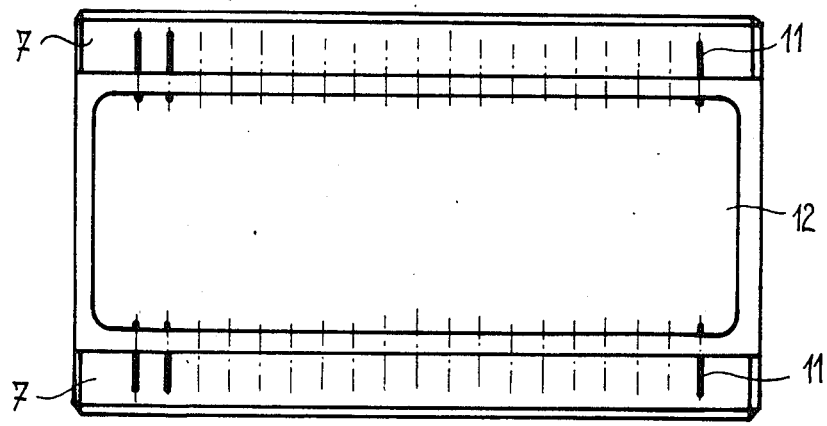

ENCAPSULATED HOUSING FOR DISSIPATING HEAT PRODUCED BY ELECTRICAL CIRCUITS

BACKGROUND OF THE INVENTION

The present invention concerns an encapsulated housing or box for dissipating the heat produced by electrical circuits.

It is known that the present evolution of integrated circuits and hybrid circuits leads to heat dissipation per surface unit which is constantly increasing.

The calories that are thus produced must be evacuated through the intermediary of the housing on which the circuit(s) is(are) assembled.

Therefore, when the junctions of a semi-conductor device in operation are brought to a temperature distinctly higher than the maximum recommended value, a modification of their surface state can be produced which causes irreversible cumulative deterioration or impairment in the characteristics of the device. For certain components made of silicon, the maximal temperature of the junction is about 200° C., but a lower limit is often necessary, particularly in the case of devices encapsulated within a plastic material. Reliability is generally improved through operating at temperatures distinctly lower than the maximal recommanded value.

It is therefore essential that the housing ensures an optimal heat or thermal resistance for it to be adapted to ensuring the evacuation of a high number of calories per surface unit of the substrate (by way of example, heat resistances as low as 1° C./W are desirable).

Integrated circuits are often assembled in modules or units that have a metallic cap. Heat transfer implies a transfer of the integrated circuit towards an external dissipator. When the amount of heat which must be dissipated is relatively small, the metallic cap of the module or unit can be open to air and the bottom of the module or unit connected to the printed circuit through the intermediary of pins. The heat of the integrated circuit is thus dissipated through the substrate of the circuit upon which the module or unit is assembled and through the metallic cap of this unit.

In certain applications, the quantity of heat dissipated in this way is insufficient.

Different devices exist that permit a greater dissipation of heat of integrated circuits.

Therefore, known hermetically sealed boxes or housings are currently available which are constituted by a body or sink or cup into whch are sealed with a borosilicate glass seals that are also made of an Iron-Nickel-Cobalt alloy. A substrate is stuck or brazed to the bottom of the housing which, due to the fact that it is made of an Iron-Nickel-Cobolt alloy, is a poor heat dissipator.

Thereby, the article of IBM TECHNICAL DISCLOSURE BULLETIN vol. 19 no. 8 of January 1977 entitled "Multimode heat sink" describes a device that comprises a heat dissipator provided with recipients. The units, that are assembled on a printed circuit, are disposed inside the recipients. Welding at low melting temperature ensures the connection between the units and the bottom of the recipients. This dissipator can include a water circulation circuit that allows to transfer the heat towards the outside.

But such a device is not modular. Contrary to this, the housing according to the invention allows to realize a circulation network of heat-carrying fluid that allows cooling as close as possible to the pieces and thus avoids the need to reheat the pieces that have remained cold.

SUMMARY OF THE INVENTION

The object of the present invention is to provide an improved encapsulated housing or box for the dissipation of heat produced by electrical circuits. The housing includes a metallic armature which has an upper portion with a recess. The bottom of the recess is intended to receive an electrical circuit. The lateral walls of the recess support the connections of the circuit through insulating seals. A cap for the recess is provided on its upper surface so as to render the recess hermetic. The armature has on its lower portion a device for cooling which carries a cooling fluid. Channels for the fluid are formed between lateral walls forming a metallic single piece assembly. The channels are regularly spaced apart with openings provided at the ends of lateral walls so that the cooling fluid may circulate between adjacent channels. Two metallic elements are attached to the ends of the lateral walls so as to seal the channels. Two holes are formed in the metallic elements to allow the cooling fluid to flow in and out of the channels.

BRIEF DESCRIPTION OF THE DRAWINGS

The invention will become more apparent by reading through the following description given by way of non-limitative illustration with reference to the appended drawings in which:

FIG. 1 represents a device according to the prior art;

FIG. 2 represents the housing according to the invention;

FIG. 3 is a partial cross-sectional side view of the housing according to the invention;

FIG. 4 is a cross-sectional view as indicated by line A—A' in FIG. 3;

FIG. 5 is a cross-sectional view of a modified form of the housing according to the invention;

FIG. 6 is a side view of the housing according to the invention;

FIG. 7 is a side view of the housing according to the invention;

FIG. 8 represents a view from below of the housing according to the invention.

DESCRIPTION OF THE PREFERRED EMBODIMENT

FIG. 1 illustrates a device according to the prior art described in "IBM TECHNICAL DISCLOSURE BULLETIN" vol. 19, no. 8 dated January 1977 entitled "Multimode heat sink" in which modules or units 1 are assembled on a substrate 4 according to any conventional method. The underneath of the units 1, on the contrary, is placed in receptacles 2 on heat dissipator 3. This non-assembled structure is illustrated in FIG. 1. A low melting point welding (not shown), surrounds each of the units and achieves a close connection between the units and heat dissipator 3. This heat dissipator 3 can include a passage 5 for water circulation that allows conveying the heat towards the outside. This structure is assembled by causing to melt the welding and by placing the substrate with units 1 in receptacles 2 of heat dissipator 3.

The invention itself concerns an encapsulated housing for an electrical circuit in which is integrated its cooling system through the circulation of the heat-carrying fluid. As represented in FIG. 2, this housing comprises a metallic armature 6 supporting the connecting wires of the electrical circuit and at least one cover 15 welded onto the armature, one or several cooling systems utilizing heat-carrying fluid with its circulation network 16.

The invention is more particularly utilizable for producing high power encapsulated housings operating with components producing a strong heat dissipation.

Armature 6 of the housing comprises several parts; a recess 12 allowing the positioning of the components, either by mechanical attachment or by soft brazing or by pre-wired circuit stuck onto the bottom 13 of recess 12, on the lateral walls of the housing the connecting wires are pins 11 of various dimensions sealed by metal seal association and implanted on the armature by brazing, and often spaced apart by 2.54 mm or 5.08 mm according to the electronic wiring standards.

Therefore, the connections are present in the form of pins 11, each of which is maintained in position by an insulating seal 9 disposed in a steel sleeve 10, for example. In a conventional example, a glass pearl is utilized for the seals. Each pin 11 has a portion extending from the outside of the housing and which ends in a nosepiece, and a portion extending from the outside of the housing intended for the welding of a connecting wire from the circuit(s) with which the housing must be provided; after assembling several electrical circuits in a recess 12 on the housing, a cover 15 is welded or brazed onto frame 17 so as to render the housing hermetically sealed.

Thus, the bottom of this recess 12 allows through adjunction of a metallic frame 17 to obtain closing by welding or by soldering and also to have an encapsulated housing that is helium-proof, for example.

On this encapsulated housing forming a single-piece assembly, one or several circulation networks 16 can be integrated to the whole. Network 16 for the circulation of the heat-carrying fluid is achieved in the body by channels 21 which may be formed by boring holes in the armature. The openings in the ends of the channels allow to establish the free circulation of the fluid(s), the tightness being achieved by two metallic pieces 7 brazed on each side 8 of these borings.

FIG. 3 represents the metallic armature 6 alone provided in its upper portion with a cavity 12 the bottom of which is intended for the attachment of the electrical circuits and the lateral walls of which comprise holes 23 which allow positioning connecting pins 11. This armature 6 is provided in its lower portion with circulation networks 16 through the circulation of at least one heat-carrying fluid which comprises a single-piece assembly between lateral walls 30 and 31 from which have been formed channels 21 in parallel directions and regularly spaced apart as represented in FIG. 4 which is a cross-section view along line A—A'.

Openings 22 were thereafter formed between certain of these bores 21 at their ends, as represented in FIG. 5 which is also a cross-section along line A—A' so as to obtain the desired circulation network of the heat-carrying fluid.

FIG. 6 represents a view from wall 31 of this metallic armature, once channels 21 and openings 22 have been formed.

The two metallic elements 7, represented in FIG. 2, are disposed on lateral walls 30 and 31 of this metallic armature 6 so as to seal off the ends of these channels 21 and these openings 22.

These circulation networks 16 comprise at least two holes 19, 20 so as to allow the introduction and the evacuation of the heat-carrying fluid. These holes 19, 20 can be formed in one of these two metallic elements 7, as represented in FIG. 7, but they can equally as well be formed in the bottom of metallic armature 6.

The heat carrying fluid can be supplied to and removed from holes 19 and 20 through suitable connections (not shown). The connections may be brazed onto metallic elements 7 or may be adhered thereto with an adhesive. A heat exchanger or refrigerating fluid source may then supply the heat carrying fluid to these connections.

FIGS. 7 and 8 represent a side view and a view from below of the housing according to the invention such as represented in FIG. 1.

Therefore, the housing according to the invention carries out a conduction function between the electrical circuits and the cooling means through the thickness of metal of the metallic armature situated between bottom 13 of recess 12 and channels 21.

It also achieves an exchange function through its utilization of at least one heat-carrying fluid.

It thus integrates the conducting portion of the heat and the heat exchange portion.

The housing according to the invention has cooling means that are modular. In fact, it allows to produce, as required, series circuits, with parallel fluid circulation so as to achieve cooling as close as possible of the heated pieces without heating the pieces that have remained cold. By being able to do this without varying the exchange surface, which is a function of the diameter of the channels and openings, at constant out-flow, it is possible to cause to vary the thermal resistance of the whole of the cooling means.

It is also possible with such a housing to regulate the heat-carrying at a pre-determined temperature. It is furthermore possible to consider several cooling circuits that are independent or which interconnect with one another.

The housing according to the invention allows, furthermore, to encapsulate large-size systems having dimensions, for example of 150 mm×150 mm.

The materials utilized for metallic armature 6 and the two metallic elements 7 are generally copper- or aluminum-based alloys, chosen for their good heat conductivity.

Therefore, copper-based alloys can be cuprochromium or copper-beryllium-cobalt alloys, for example, which allow to obtain hard materials, which are resistant to corrosion and have a high heat dissipation coefficient. The brazings can thus be high temperature eutectic silver-copper brazings that melt at about 780° C.

Aluminum-based alloys can be aluminum-silicon alloys. The brazings can thus be eutectic lead-silver brazings that melt at about 315° C.

Frame 17 and cover 15 can be made of iron-nickel-cobalt.

Protective coatings can be applied to the whole of the housing, for example, made of nickel, tin or gold.

The heat-carrying fluids can be, for example, water or oil.

The electrical circuits can be components disposed on a printed circuit board that is stuck to the bottom 13 of recess 12. They can also be hyperfrequency circuits that are mechanically attached to the bottom 13 of recess 12.

I claim:

1. Housing for the dissipation of heat produced by electrical circuits, comprising a metallic armature provided in its upper portion with a recess, the bottom of said recess being intended for the attachment of the electrical circuits, and lateral walls of said recess support connections through the intermediary of insulating seals, a cover being disposed at the surface of said recess in such a way as to render it hermetically sealed, and said armature having in a lower portion cooling means for the circulation of at least one cooling fluid, said cooling means comprising a metallic single-piece assembly having lateral walls and separating channels which are arranged in parallel directions and are regularly spaced apart, and said channels having openings formed between the ends of certain of said channels, in such a way as to obtain a circulation network, and two metallic elements disposed on lateral walls of said single-piece assembly so as to seal off the ends of the channels and the openings, the cooling means comprising at least two openings as an inlet and an outlet of the cooling fluid.

2. Housing according to claim 1, in which the two metallic elements are brazed on either side of the lower portion of the metallic armature by a brazing material.

3. Housing according to claim 1, comprising a metallic frame disposed between the metallic armature and the cover for welding the cover to the metallic armature.

4. Housing according to claim 1, in which the insulating seals are glass pearls.

5. Housing according to claim 4, wherein the glass pearls are disposed within steel sleeves.

6. Housing according to claim 1, in which the connections are pins implanted by brazing.

7. Housing according to claim 1, in which the metallic armature and the two metallic elements are made from copper-based alloys.

8. Housing according to claim 7, in which the copper-based alloys are cuprochromium alloys.

9. Housing according to claim 7, in which the copper-based alloys are copper-beryllium-cobalt alloys.

10. Housing according to claim 2, in which the brazing material is eutectic silver-copper.

11. Housing according to claim 1, in which the metallic armature and the two metallic elements are made from aluminum-based alloys.

12. Housing according to claim 11, in which the aluminum-based alloys are aluminum-silicon alloys.

13. Housing according to claim 2, in which the brazing material is eutectic lead-silver.

14. Housing according to claim 1, in which the frame and the cover are made of iron-nickel-cobalt.

15. Housing according to claim 1, having a coating made of a material selected from nickel, tin, and gold.

16. Housing according to claim 1, in which the cooling fluid is water.

17. Housing according to claim 1, in which the cooling fluid is oil.

* * * * *